US011293402B2

(12) United States Patent
Gao

(10) Patent No.: US 11,293,402 B2
(45) Date of Patent: Apr. 5, 2022

(54) METHOD AND APPARATUS FOR DETECTING A SHORT-CIRCUIT CAPACITY AT A GRID CONNECTION POINT OF A WIND TURBINE

(71) Applicant: BEIJING GOLDWIND SCIENCE & CREATION WINDPOWER EQUIPMENT CO., LTD., Beijing (CN)

(72) Inventor: Rui Gao, Beijing (CN)

(73) Assignee: BEIJING GOLDWIND SCIENCE & CREATION WINDPOWER EQUIPMENT CO., LTD., Beijing (CN)

( * ) Notice: Subject to any disclaimer, the term of this patent is extended or adjusted under 35 U.S.C. 154(b) by 273 days.

(21) Appl. No.: 16/465,792

(22) PCT Filed: Jul. 13, 2018

(86) PCT No.: PCT/CN2018/095647
§ 371 (c)(1),
(2) Date: May 31, 2019

(87) PCT Pub. No.: WO2019/178987
PCT Pub. Date: Sep. 26, 2019

(65) Prior Publication Data
US 2021/0140407 A1 May 13, 2021

(30) Foreign Application Priority Data
Mar. 21, 2018 (CN) .......................... 201810236958.9

(51) Int. Cl.
F03D 7/02 (2006.01)
H02J 3/16 (2006.01)
(Continued)

(52) U.S. Cl.
CPC ............ F03D 7/0284 (2013.01); F03D 7/048 (2013.01); G01R 31/52 (2020.01); H02J 3/16 (2013.01); H02J 3/381 (2013.01)

(58) Field of Classification Search
CPC ........ F03D 7/0284; F03D 7/048; H02J 3/381; H02J 3/16; G01R 31/52
See application file for complete search history.

(56) References Cited

U.S. PATENT DOCUMENTS

2012/0063179 A1\* 3/2012 Gong ...................... H02M 1/12
363/40
2015/0148974 A1 5/2015 Diedrichs
(Continued)

FOREIGN PATENT DOCUMENTS

CN 102347614 A 2/2012
CN 102707161 A 10/2012
(Continued)

OTHER PUBLICATIONS

International Search Report and Written Opinion dated Dec. 26, 2018; PCT/CN2018/095647.
(Continued)

Primary Examiner — Tulsidas C Patel
Assistant Examiner — Joseph Ortega

(57) ABSTRACT

The present disclosure discloses a method and apparatus for detecting a short-circuit capacity at a grid connection point of a wind turbine. The method includes: modulating, when a converter is in a grid-side no-load modulation state and a power grid is in a short-circuited state with respect to the converter, a reactive power reference value and a braking power reference value of the converter; collecting a modulated three-phase voltage signal and a modulated three-phase current signal at the grid connection point of the wind turbine; and obtaining, according to the modulated three-phase voltage signal and the modulated three-phase current
(Continued)

signal at the grid connection point of the wind turbine as well as a rated line voltage at the grid connection point of the wind turbine, the short-circuit capacity at the grid connection point of the wind turbine.

12 Claims, 7 Drawing Sheets

(51) Int. Cl.
  *F03D 7/04* (2006.01)
  *H02J 3/38* (2006.01)
  *G01R 31/52* (2020.01)

(56) References Cited

U.S. PATENT DOCUMENTS

| | | | |
|---|---|---|---|
| 2017/0025855 A1 | 1/2017 | Garcia | |
| 2017/0122291 A1* | 5/2017 | Barker | F03D 7/048 |

FOREIGN PATENT DOCUMENTS

| | | |
|---|---|---|
| CN | 103490410 A | 1/2014 |
| CN | 103870703 A | 6/2014 |
| CN | 104167939 A | 11/2014 |
| CN | 104779644 A | 7/2015 |
| CN | 105098842 A | 11/2015 |
| CN | 105548741 A | 5/2016 |
| CN | 105548781 A | 5/2016 |
| CN | 106712081 A | 5/2017 |
| CN | 107370161 A | 11/2017 |
| WO | 2014/005550 A1 | 1/2014 |

OTHER PUBLICATIONS

Seyed Morteza Alizadeh, et al; "Investigation into the impact of PCC Parameters on Voltage Stability in a DFIG Wind Farm", IEEE; Feb. 8, 2018; 6 pages.

G. Dimarzio, et al; "Implication of Grid Code Requirements on Reactive Power Contribution and Voltage Control Strategies for Wind Power Integration", IEEE 2007 International Conference on Clean Electrical Power; May 21-23, 2007; 5 pages.

The First Chinese Office Action dated Jan. 22, 2020; Appln. No. 201810236958.9.

The Second Chinese Office Action dated Mar. 16, 2020; Appln. No. 201810236958.9

Extended European Search Report dated Jan. 17, 2020; Appln. No. 18882270.4.

First Indian Office Action dated Apr. 21, 2021; Appln. No. 201917021523.

* cited by examiner

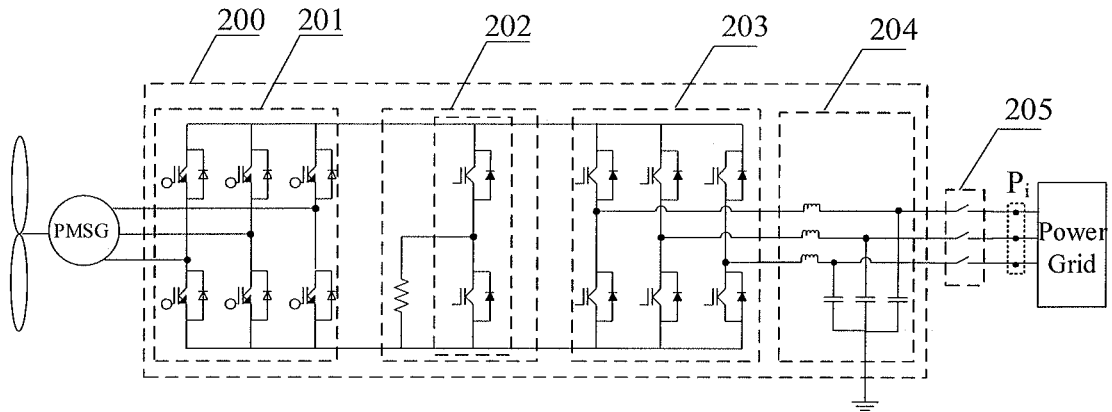

Fig. 2

```
modulating, when a converter is in a grid-side no-load
modulation state and a power grid is short-circuited with the
converter, a reactive power reference value and a braking
power reference value of the converter, and collecting a
modulated three-phase voltage signal and a modulated three-
phase current signal of the grid connection point in the wind
turbine system
```
301

```
obtaining, according to the modulated three-phase voltage
signal and the modulated three-phase current signal of the grid
connection point in the wind turbine system as well as a rated
line voltage of the grid connection point in the wind turbine
system, the short-circuit capacity of the grid connection point
in the wind turbine system
```
302

Fig. 3

```
                  ┌─────────────────────────────────────────────────────┐
                  │  the first no-load modulation operation and a second no-load  │
                  │     modulation operation are performed on the converter,       │─── 801
                  │                         respectively                            │
                  └─────────────────────────────────────────────────────┘
                                            │
                                            ▼
      ┌─────────────────────────────────────────────────────────────────┐
      │    a second short-circuit voltage effective value, a second     │
      │       reactive power feedback value and a first active power    │
      │        feedback value are obtained according to the three-phase │
      │  voltage signal and the three-phase current signal after the first │── 802
      │       no-load modulation operation, and a third short-circuit   │
      │  voltage effective value, a third reactive power feedback value │
      │       and a second active power feedback value are obtained     │
      │      according to the three-phase voltage signal and the three- │
      │      phase current signal after the second no-load modulation   │
      └─────────────────────────────────────────────────────────────────┘
                                            │
                                            ▼
      ┌─────────────────────────────────────────────────────────────────┐
      │   a second initial voltage effective value is obtained according │
      │  to the three-phase voltage signal of the grid connection point  │── 803
      │  of the wind turbine when the power grid is disconnected with    │
      │                         the converter                            │
      └─────────────────────────────────────────────────────────────────┘
                                            │
                                            ▼
      ┌─────────────────────────────────────────────────────────────────┐
      │     the inductive reactance in the line impedance and the       │
      │  resistance in the line impedance are obtained according to the │
      │  second initial voltage effective value, the second short-circuit│── 804
      │   voltage effective value, the second reactive power feedback   │
      │    value, the first active power feedback value, the third short-│
      │       circuit voltage effective value, the third reactive power │
      │    feedback value and the second active power feedback value    │
      └─────────────────────────────────────────────────────────────────┘
                                            │
                                            ▼
      ┌─────────────────────────────────────────────────────────────────┐
      │   the short-circuit capacity at the grid connection point of the │
      │        wind turbine is obtained according to the inductive      │── 805
      │       reactance, the resistance and the rated line voltage      │
      └─────────────────────────────────────────────────────────────────┘
```

Fig. 8

METHOD AND APPARATUS FOR DETECTING A SHORT-CIRCUIT CAPACITY AT A GRID CONNECTION POINT OF A WIND TURBINE

CROSS-REFERENCE TO RELATED APPLICATION

This application is a National Stage of International Application No. PCT/CN2018/095647, filed on Jul. 13, 2018, which claims priority to Chinese Patent Application No. 201810236958.9 filed on Mar. 21, 2018 and titled with "METHOD AND APPARATUS FOR DETECTING A SHORT-CIRCUIT CAPACITY AT A GRID CONNECTION POINT OF A WIND TURBINE", both of which are incorporated herein by reference in their entireties.

TECHNICAL FIELD

The present application relates to the field of wind power technologies, and in particular, to a method and apparatus for detecting a short-circuit capacity at a grid connection point of a wind turbine.

BACKGROUND

Wind power generated by each of wind turbines in a wind farm is incorporated into a power grid by a power system. When the wind turbine is in a no-load modulation state, a turbine-side rectifier does not operate while a grid-side inverter is still connected to a low-voltage side of the power system, which means the load of the power system is nearly empty and can be considered to be in short-circuit operation. A short-circuit ratio of a wind farm is a parameter that characterizes bearing capability of the wind farm during short-circuit operation. Since there may be multiple wind turbines in the wind farm that are in the no-load modulation state at the same time, a sufficiently high short-circuit ratio is required for the wind farm to maintain its stable operation. Usually, the short-circuit ratio for a wind farm needs to be about 1.7 to 2.

The inventors of the present application have found that the short-circuit ratio of a wind farm may be calculated according to a short-circuit capacity at a grid connection point of a wind turbines system. However, there is no a method for detecting a short-circuit capacity at a grid connection point of a wind turbines system in related art, and the short-circuit ratio of a wind farm would be found to be already lower only when oscillation of the power system occurs, which is not conductive to stable operation of the wind farm.

SUMMARY

The present application provides in embodiments thereof a method and apparatus for detecting a short-circuit capacity at a grid connection point of a wind turbine, which enables effectively detection of a short-circuit capacity at a grid connection point of a wind turbine.

In a first aspect, the present application provides in embodiments a method for detecting a short-circuit capacity at a grid connection point of a wind turbine. The method includes: modulating, when a converter is in a grid-side no-load modulation state and a power grid is in a short-circuited state with respect to the converter, a reactive power reference value and a braking power reference value of the converter; collecting a modulated three-phase voltage signal and a modulated three-phase current signal at the grid connection point of the wind turbine; and obtaining, according to the modulated three-phase voltage signal and the modulated three-phase current signal at the grid connection point of the wind turbine as well as a rated line voltage at the grid connection point of the wind turbine, the short-circuit capacity at the grid connection point of the wind turbine.

In a second aspect, the present application provides in embodiments an apparatus for detecting a short-circuit capacity at a grid connection point of a wind turbine. The apparatus includes: a modulation module configured to modulate, when a converter is in a grid-side no-load modulation state and a power grid is in a short-circuited state with respect the converter, a reactive power reference value and a braking power reference value of the converter, and collect a modulated three-phase voltage signal and a modulated three-phase current signal at the grid connection point of the wind turbine; and a calculation module configured to obtain, according to the modulated three-phase voltage signal and the modulated three-phase current signal at the grid connection point of the wind turbine as well as a rated line voltage at the grid connection point of the wind turbine, the short-circuit capacity at the grid connection point of the wind turbine.

In embodiments of the present application, in order to detect a short-circuit capacity at a grid connection point of a wind turbine, a reactive power reference value and a braking power reference value of the converter are modulated when the converter is in a grid side no-load modulation state and a power grid is in a short-circuited state with respect the converter, modulated three-phase voltage signal and modulated three-phase current signal at the grid connection point of the wind turbine are collected, and then the short-circuit capacity at the grid connection point of the wind turbine can be obtained according to the modulated three-phase voltage signal and the modulated three-phase current signal as well as a rated line voltage at the grid connection point of the wind turbine.

Since the modulated three-phase voltage signal and the modulated three-phase current signal at the grid connection point of the wind turbine in embodiments of the present application are signals when the power system is in a low-voltage side short-circuit state, the modulated three-phase voltage signal and the modulated three-phase current signal can be utilized to obtain impedance parameters during the power system is in the short-circuit state, and then the resulted impedance parameters together with a rated line voltage at the grid connection point of the wind turbine can be used to obtain the short-circuit capacity at the grid connection point of the wind turbine.

BRIEF DESCRIPTION OF THE DRAWINGS

FIG. 2 is a schematic diagram of a grid connection structure of a wind turbine according to an embodiment of the present application;

FIG. 3 is a schematic flow chart of a method for detecting a short-circuit capacity at a grid connection point of a wind turbine according to an embodiment of the present application;

FIG. 8 is a schematic flow chart of a method for detecting a short-circuit capacity at a grid connection point of a wind turbine according to yet another embodiment of the present application;

101—wind turbine; 102—medium voltage bus (102_1, 102_2 and 102_3); 103—high voltage bus; 104—substation outlet line; 105—medium/low voltage transformer; 106—high/medium voltage transformer; 107—central control equipment; 200—converter; 201—rectifier; 202—braking unit; 2021—braking resistance; 2022—switch in the braking unit; 203—inverter; 2031—switch in the inverter; 204—filter; 205—main breaker.

DETAILED DESCRIPTION

Features and exemplary embodiments of various aspects of the present application are described in detail below. In the following detailed description, numerous specific details are set forth in order for provide complete understanding of the present application.

The present application provides in embodiments a method and apparatus for detecting a short-circuit capacity at a grid connection point of a wind turbine, which enables effectively detection of a short-circuit capacity at a grid connection point of a wind turbine. Thereby, a short-circuit ratio of a wind farm can be calculated according to the detected short-circuit capacity at the grid connection point of the wind turbine, so as to assistant early warning of the wind farm to avoid knowing that the short-circuit ratio of the wind farm is too low until oscillation of the power system occurs, thereby safe stable operation of the wind farm can be ensured.

Figure 1:
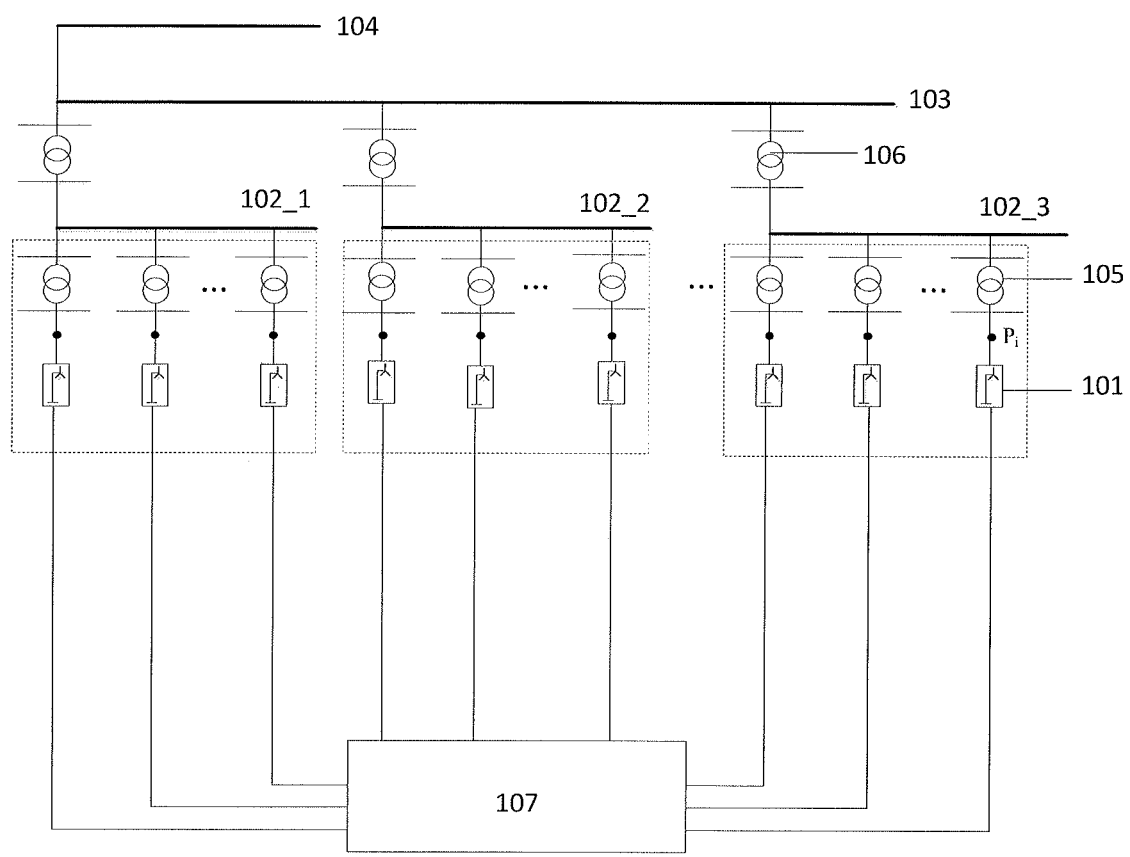
FIG. 1 is a schematic structural diagram of a power system in a wind farm according to an embodiment of the present application.

FIG. 1 is a schematic structural diagram of a power system in a wind farm according to an embodiment of the present application. As shown in FIG. 1, lines which are between wind turbines 101 and a power grid may include medium voltage buses (including 102_1, 102_2, and 102_3), high voltage bus 103 and substation outlet line 104 in the order.

Also shown in FIG. 1 is a medium/low voltage transformer 105 and a high/medium voltage transformer 106. Electric power generated by the wind turbine 101 is firstly incorporated into the medium voltage bus 102 via the medium/low voltage transformer 105, and then incorporated into the high voltage bus 103 via the high/medium voltage transformer 106, and finally incorporated into the power grid via the substation outlet line 104.

Also shown in FIG. 1 is a central control device 107 for the wind farm. The central control device 107 is connected to the wind turbines 101 in the wind farm respectively, and can conduct data transmission and control signal transmission with the wind turbines 101 respectively.

Also shown in FIG. 1 is a grid connection point Pi of each of the wind turbines in the wind farm. The grid connection point Pi of each wind turbine is located between the wind turbine 101 and a corresponding medium/low voltage transformer 105. That is, the grid connection point Pi is located at a low-voltage side of the medium/low voltage transformer 105. Therefore, a low-voltage side of the power system may be understood as its side that is proximity to the grid connection point Pi of the wind turbine.

FIG. 2 is a schematic diagram of a grid connection structure of a wind turbine according to an embodiment of the present application. As shown in FIG. 2, a converter 200 is provided between the wind turbine and the power grid, and the converter 200 includes a rectifier 201, a braking unit 202, an inverter 203 and a filter 204 in an order from the turbine side to the grid side.

The rectifier 201 is configured to rectify three-phase alternating current generated by the wind turbine. The braking unit 202 is configured to consume active power to maintain DC bus voltage at a stable value. The inverter 203 is configured to reconvert the rectified direct current into three-phase alternating current such that it is can be incorporated into the power grid.

The filter 204 is configured to generate reactive power. The filter 204 shown in FIG. 2 may be a harmonic filter composed of a plurality of sets of capacitors and inductors in parallel, and may be capable of generating capacitive reactive power.

Also shown in FIG. 2 is a main breaker 205 located between a grid side of the filter 204 and the grid connection point Pi of the wind turbine for controlling connection and disconnection between the power grid and the converter 200.

FIG. 3 is a schematic flowchart of a method for detecting a short-circuit capacity at a grid connection point of a wind turbine according to an embodiment of the present invention. The method for detecting the short-circuit capacity includes steps 301 and 302.

In step 301, when a converter is in a grid-side no-load modulation state and a power grid is in a short-circuited state with respect to the converter, a reactive power reference value and a braking power reference value of the converter are modulated, and a modulated three-phase voltage signal and a modulated three-phase current signal at the grid connection point of the wind turbine are collected.

Since when the converter is in the grid-side no-load modulation state, lines between the converter and a low-voltage side of the power system is turned on, that is, the main breaker is in a closed state, and the wind turbine is in a shutdown or standby state, that is, the rectifier near the generator is in an unmodulated state and the inverter near the power grid is in a modulatable state. This means load at the low-voltage side of the power system is nearly empty. Therefore, when the converter is in the grid-side no-load modulation state, the power system can be considered as in an operation under short-circuited situation. At this time, the reactive power reference value is usually assigned a value of 0, and the actual active power value is losses of the converter.

In an alternative embodiment, the converter may be actively set to the grid-side no-load modulation state and the power grid is in a short-circuited state with respect to the converter.

In an alternative embodiment, it may also be that the converter is voluntarily in the grid-side no-load modulation state, and the power grid is in a short-circuited state with respect to the converter.

In step 302, the short-circuit capacity at the grid connection point of the wind turbine is obtained according to the modulated three-phase voltage signal and the modulated three-phase current signal at the grid connection point of the wind turbine as well as a rated line voltage at the grid connection point of the wind turbine.

In embodiments of the present application, in order to detect a short-circuit capacity at a grid connection point of a wind turbine, a reactive power reference value and a braking power reference value of the converter are modulated when the converter is in a grid side no-load modulation state and a power grid is in a short-circuited state with respect to the converter, modulated three-phase voltage signal and modulated three-phase current signal at the grid connection point of the wind turbine are collected, and then the short-circuit capacity at the grid connection point of the wind turbine can be obtained according to the modulated three-phase voltage signal and the modulated three-phase current signal as well as a rated line voltage at the grid connection point of the wind turbine.

Since the modulated three-phase voltage signal and the modulated three-phase current signal at the grid connection point of the wind turbine in embodiments of the present application are signals when the power system is in a low-voltage side short-circuit state, the modulated three-phase voltage signal and the modulated three-phase current signal can be utilized to obtain impedance parameters during the power system is in the short-circuit state, and then the resulted impedance parameters together with a rated line voltage at the grid connection point of the wind turbine can be used to obtain the short-circuit capacity at the grid connection point of the wind turbine.

Further, a short-circuit ratio of a wind farm can be calculated based on the short-circuit capacity at the grid connection point of the wind turbine detected according to embodiments of the present application, so as to assistant early warning of the wind farm to avoid knowing that the short-circuit ratio of the wind farm is too low until oscillation of the power system occurs, thereby safe stable operation of the wind farm can be ensured.

In order to facilitate understanding by those skilled in the art, the method for detecting a short-circuit capacity at a grid connection point of a wind turbine according to embodiments of the present application will be described in detail below.

Figure 4:
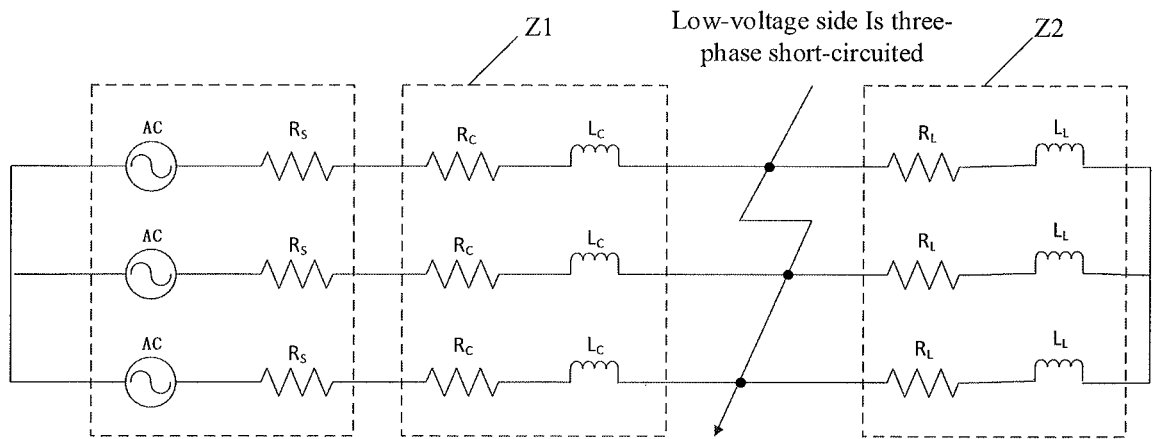
FIG. 4 is an equivalent circuit diagram of a power system having low-voltage side short-circuited according to an embodiment of the present application.

FIG. 4 is an equivalent circuit diagram of a power system having low-voltage side short-circuited according to an embodiment of the present application.

As shown in FIG. 4, when the power grid is in a short-circuited state with respect to the converter, that is, when the low-voltage side is three-phase short-circuited, the low-voltage side of the power system can be equivalent to a low-voltage side power source AC, an internal resistor Rs and line impedance Z1 connected in series.

$Z1=R_c+X_c$, where $R_c$ is resistance value in the line impedance Z1, and $X_c$ is the inductive reactance in the line impedance Z1.

$Xc=\omega \times Lc$, where Lc is coil inductance in the line impedance Z1 and $\omega$ is angular velocity in the line impedance Z1.

Also shown in FIG. 4 is a low-voltage side impedance Z2, $Z2=R_L+X_L$, where $R_L$ is resistance value in the low-voltage side impedance Z2 and $X_L$ is inductive reactance in the low-voltage side impedance Z2.

$X_L=\omega \times L_L$, where $L_L$ is coil inductance in the low-voltage side impedance Z2 and $\omega$ is angular velocity in the low-voltage side impedance Z2.

Figure 5:
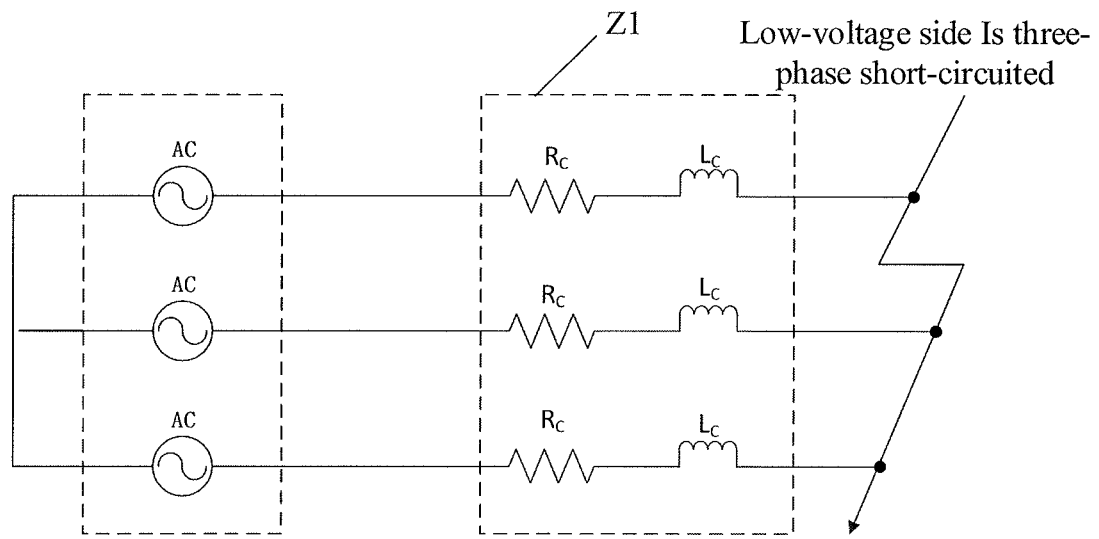
FIG. 5 is an equivalent circuit diagram of a power system having low-voltage side short-circuited corresponding to FIG. 4 when an internal resistance Rs of the power system is much smaller than the line impedance Z1 according to an embodiment of the present application.

FIG. 5 is an equivalent circuit diagram of a power system having low-voltage side short-circuited corresponding to FIG. 4 when the internal resistor Rs of the power system is much smaller than the line impedance Z1 according to an embodiment of the present application. That is, a difference between the line impedance Z1 and the internal resistance Rs is greater than a first predetermined threshold. The first predetermined threshold may be determined according to actual operation conditions of the power system and experience of those skilled in the art.

As can be seen from FIG. 5, since the internal resistance Rs of the power system is much smaller than the line impedance Z1, the internal resistance Rs is omitted from the equivalent circuit of the power system when its low-voltage side is short-circuited. In addition, the low-voltage side impedance Z2 is also omitted in FIG. 5 to simplify configuration of the equivalent circuit.

Figure 6:
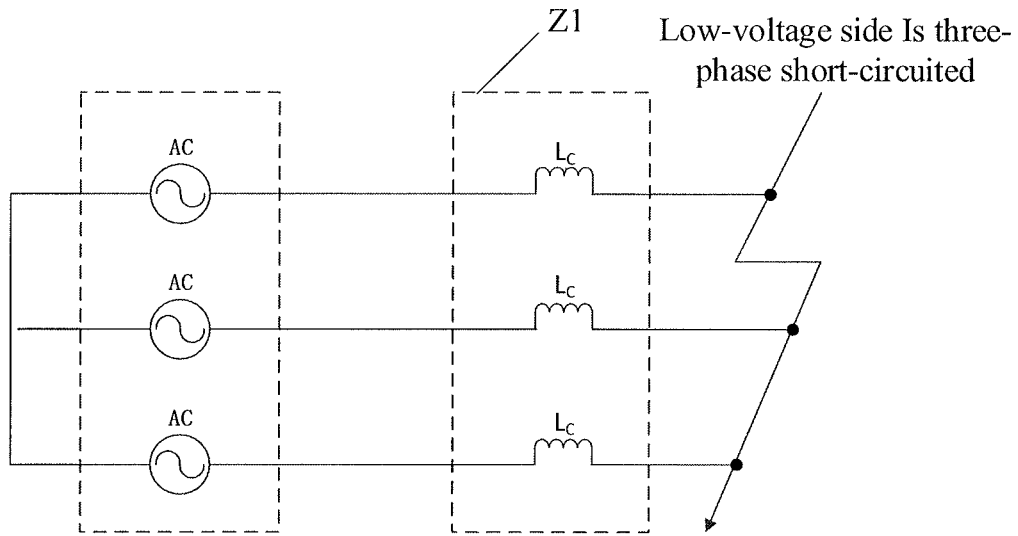
FIG. 6 is an equivalent circuit diagram of a power system having low-voltage side short-circuited corresponding to FIG. 5 when resistance Rc is much smaller than inductive reactance $X_e$ in the line impedance Z1 according to an embodiment of the present application.

FIG. 6 is an equivalent circuit diagram of a power system having low-voltage side short-circuited corresponding to FIG. 5 when resistance Rc of Z1 in the line impedance is much smaller than inductive reactance Xc according to an embodiment of the present application. That is, a difference between the inductive reactance Xc and the resistance Rc in the line impedance Z1 is greater than a second predetermined threshold. The second predetermined threshold may be determined according to actual operation conditions of the power system and experience of those skilled in the art.

As can be seen from FIG. 6, since the resistance Rc is much smaller than the inductive reactance Xc in the line impedance Z1, the resistance Rc is omitted from the equivalent circuit of the power system when its low-voltage side is short-circuited.

The steps in FIG. 3 will be described in detail below with reference to the equivalent circuit diagrams in FIGS. 5 and 6.

Considering that the equivalent circuit in FIG. 6 is more simplified than that in FIG. 5, the steps in FIG. 3 will be firstly described in detail in conjunction with the equivalent circuit diagram in FIG. 6.

Figure 7:
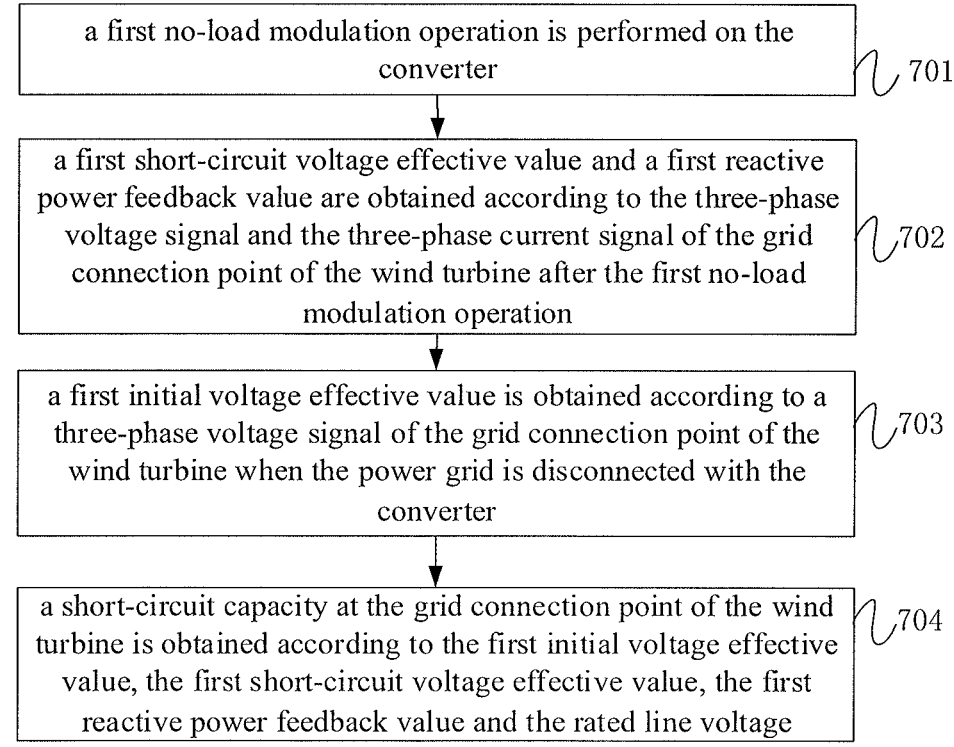
FIG. 7 is a schematic flowchart diagram of a method for detecting a short-circuit capacity at a grid connection point of a wind turbine according to another embodiment of the present application.

FIG. 7 is a schematic flowchart diagram of a method for detecting a short-circuit capacity at a grid connection point of a wind turbine according to another embodiment of the present application. The method for detecting the short-circuit capacity includes steps 701 to 704, where the internal resistance Rs of the power system is much smaller than the line impedance Z1, and the resistance Rc is much smaller than the inductive reactance Xc (see FIG. 6).

In step 701, a first no-load modulation operation is performed on the converter.

In the first no-load modulation operation, the reactive power reference value is set to any power value between 0 and a rated apparent power of an inverter in the converter and the braking power reference value is set to zero.

In step 702, a first short-circuit voltage effective value and a first reactive power feedback value are obtained according to a three-phase voltage signal and a three-phase current signal at the grid connection point of the wind turbine after the first no-load modulation operation.

In step 703, a first initial voltage effective value is obtained according to a three-phase voltage signal at the grid connection point of the wind turbine when the power grid is disconnected with the converter. Specifically, the main breaker can be switched off to disconnect the power grid with the converter.

In step 704, a short-circuit capacity at the grid connection point of the wind turbine is obtained according to the first initial voltage effective value, the first short-circuit voltage effective value, the first reactive power feedback value and the rated line voltage.

Specifically, the inductive reactance in the line impedance can be obtained according to the first initial voltage effective value, the first short-circuit voltage effective value and the first reactive power feedback value, and then the short-circuit capacity at the grid connection point of the wind turbine is obtained according to the inductive reactance and the rated line voltage.

In an example, the short-circuit capacity $S_d$ at the grid connection point of the wind turbine can be expressed as:

$$S_d = U_n^2 / X_c \qquad (1)$$

where $U_n$ is the rated line voltage at the grid connection point of the wind turbine and $X_c$ is the inductive reactance value in the line impedance.

FIG. 8 is a schematic flow chart of a method for detecting a short-circuit capacity at a grid connection point of a wind turbine according to yet another embodiment of the present application. The method for detecting the short-circuit capacity includes steps 801 to 805, where the internal resistance Rs of the power system is much smaller than the line impedance Z1, and the resistance Rc is not much smaller than the inductive reactance Xc (see FIG. 5).

In step 801, the first no-load modulation operation and a second no-load modulation operation are performed on the converter respectively. In the second no-load modulation operation, the reactive power reference value is set to 0, and the braking power reference value is set to any power value between 0 and the rated apparent power.

The first no-load modulation operation and the second no-load modulation operation may be performed in a reversed order. In general, the latter operation may be performed after a period of execution of the previous operation to improve stability for data collection.

In step 802, a second short-circuit voltage effective value, a second reactive power feedback value and a first active power feedback value are obtained according to a three-phase voltage signal and a three-phase current signal after the first no-load modulation operation, and a third short-circuit voltage effective value, a third reactive power feedback value and a second active power feedback value are obtained according to the three-phase voltage signal and the three-phase current signal after the second no-load modulation.

At step 803, a second initial voltage effective value is obtained according to the three-phase voltage signal at the grid connection point of the wind turbine when the power grid is disconnected with the converter.

In step 804, the inductive reactance in the line impedance and the resistance in the line impedance are obtained according to the second initial voltage effective value, the second short-circuit voltage effective value, the second reactive power feedback value, the first active power feedback value, the third short-circuit voltage effective value, the third reactive power feedback value and the second active power feedback value.

In step 805, the short-circuit capacity at the grid connection point of the wind turbine is obtained according to the inductive reactance, the resistance and the rated line voltage.

Specifically, the short-circuit capacity at the grid connection point of the wind turbine can also be expressed as:

$$S_d = U_n^2 / \sqrt{X_c^2 + R_c^2} \qquad (2)$$

where $U_n$ is the rated line voltage of the grid connection point of the wind turbine and $X_c$ is the inductive reactance value in the line impedance, and $R_c$ is the resistance value in the line impedance.

It should be noted that each of the voltage effective values may be any of one phase line voltage effective value, an average value of three-phase line voltage effective values, or positive component of a D-axis voltage, which is not limited herein.

In order to facilitate understanding by those skilled in the art, the short-circuit capacity detection process according to embodiments of the present application will be described in detail by taking the following case as an example where the internal resistance Rs of the power system is much smaller than the line impedance Z1, and the resistance Rc is not much smaller than the inductive reactance Xc (see FIG. 5).

In a first step, a data acquisition process under state 1 is performed.

(1) At time t0, the grid side main breaker of the converter is opened, so that the converter is in a disconnection state with the power grid.

(2) At time t1, a three-phase voltage signal of a grid connection point of a wind turbine is collected, and a voltage effective value $U_1$ at the grid connection point of the wind turbine is calculated according to the collected three-phase voltage signal.

(3) At time t2, the grid side main breaker of the converter is closed so that the converter is set to a grid side no-load modulation state, and the reactive power reference value is set to 0.

(4) At time t3, the reactive power reference value is set to $Q_{ref1}$, and the braking power reference value is set to 0, where $0<Q_{ref1}<$rated apparent power of the inverter.

(5) At time t4, a three-phase voltage signal and a three-phase current signal at the grid connection point of the wind turbine are collected, and an active power feedback value $P_1$ and a reactive power feedback value $Q_1$ at the grid connection point of the wind turbine are calculated according to the collected three-phase voltage signal and three-phase current signal, and a voltage effective value at the grid connection point of the wind turbine is calculated according to the collected three-phase voltage signal.

(6) At time t5, the converter is restored to the no-load modulation state, and the reactive power reference value is set to 0 in the no-load modulation state.

In a second step, a data acquisition process under state 2 is performed.

(1) At time t6, the grid side main breaker of the converter is opened, so that the wind power converter is in a disconnection state with the power grid.

(2) At time t7, a three-phase voltage signal at the grid connection point of the wind turbine is collected, and a voltage effective value $U_2$ at the grid connection point of the wind turbine is calculated according to the collected three-phase voltage signal.

(3) At time t8, the grid-side main breaker of the converter is closed, so that the converter is set to the grid side no-load modulation state, and the reactive power reference value is set to 0.

(4) At time t9, the reactive power reference value is set to 0 and the braking power reference value is set to $P_{ref1}$, where $0<P_{ref1}<$rated apparent power of the inverter.

(5) At time t10, a three-phase voltage signal and a three-phase current signal at the grid connection point of the wind turbine is collected, and an active power feedback value $P_2$ and a reactive power feedback value $Q_2$ at the grid connection point of the wind turbine are calculated according to the collected three-phase voltage signal and three-phase current signal, and a voltage effective value $U_2^*$ at the grid connection point of the wind turbine is calculated according to the collected three-phase voltage signal.

(6) At time t11, the converter is restored to the no-load modulation state, and the reactive power reference value is 0 in the no-load modulation state.

In a third step, line impedance parameters in FIG. 5, the inductive reactance Xc and the resistance Rc, are calculated according to the equation set (3).

$$\begin{cases} (U_1^* - U_1)U_1^* = P_1 R_c + Q_1 X_c \\ (U_2^* - U_2)U_2^* = P_2 R_c + Q_2 X_c \end{cases} \quad (3)$$

In a fourth step, the inductive reactance Xc and the resistance Rc are calculated according to the equation set and the short-circuit capacity at the grid connection point of the wind turbine is calculated according to the above formula (2).

It should be understood that when the resistance Rc is much smaller than the inductive reactance Xc, only one unknown parameter, i.e. inductive reactance Xc, remains in the line impedance parameter of FIG. 5, and thus, only one of the first step and the second step above needs to be performed to solve the inductive reactance Xc, and then the short-circuit capacity at the grid connection point of the wind turbine can be calculated based on the formula (2).

In addition, in order to improve accuracy of the above-mentioned reactive power feedback values $Q_1$ and $Q_2$, that is, improve control precision of the reactive power, a reactive power closed-loop adjusting device or a reactive power open-loop adjusting device may be provided in the converter.

The reactive power closed-loop adjusting device is configured to obtain, according to the modulated three-phase voltage signal and the modulated three-phase current signal at the grid connection point of the wind turbine when the power grid is short-circuited as well as the modulated reactive power reference value, a PWM (Pulse Width Modulation) signal for driving a switching device in the converter such that a reactive power output by the converter approaches the modulated reactive power reference value.

Figure 9:
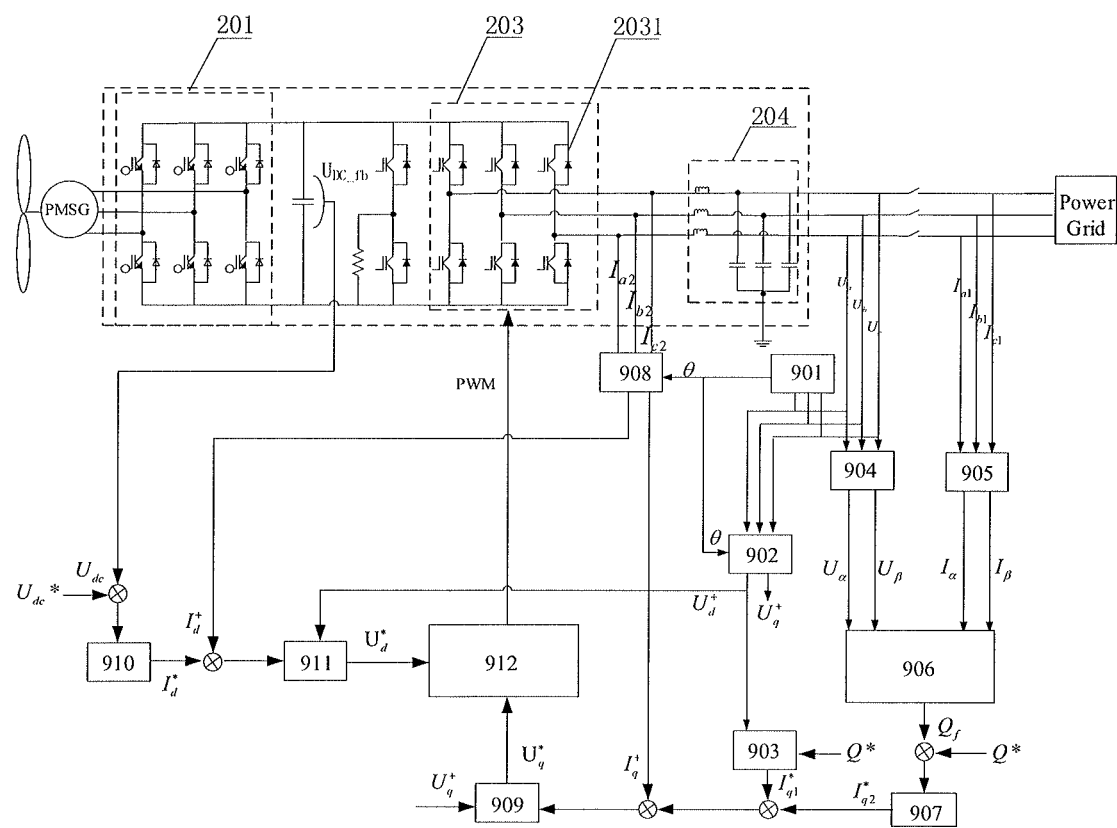
FIG. 9 is a schematic structural diagram of a reactive power closed-loop adjusting device according to an embodiment of the present application.

FIG. 9 is a schematic structural diagram of a reactive power closed-loop adjusting device according to an embodiment of the present application. The configuration of each component and its connection relationship are shown in FIG. 9.

The components shown in FIG. 9 include: a phase-locked loop 901, a first dq converter 902, a resolver 903, a three-phase-two-phase voltage coordinate converter 904, a three-phase-two-phase current coordinate converter 905, a reactive power calculator 906, a reactive power regulator 907, a second dq converter 908, a Q-axis current regulator 909, a DC bus voltage regulator 910, a D-axis current regulator 911, and a modulation signal generator 912.

Also shown in FIG. 9 are a three-phase voltage feedback signal ($U_a$, $U_b$, $U_c$) of the filter at grid side, a three-phase current feedback signal ($I_{a1}$, $I_{b1}$, $I_{c1}$) of the filter at grid side, and a three-phase current feedback signal ($I_{a2}$, $I_{b2}$, $I_{c2}$) between the inverter and the filter. Since the grid side of the filter is in an equipotential state with the grid connection point of the wind turbine, the grid side of the filter may also be understood as the grid connection point of the wind turbine.

The process for adjusting reactive power of the converter will be described in detail below with reference to the reactive power closed-loop adjusting device in FIG. 9.

S1: a reactive power feedback value of grid side of the filter is calculated according to formula (4).

$$Q_c = U_{a\_rms}^2 \times 2 \times \pi \times f \times C_a + U_{b\_rms}^2 \times 2 \times \pi \times f \times C_b + U_{c\_rms}^2 \times 2 \times \pi \times f \times C_c \quad (4)$$

where $U_{a\_rms}$, $U_{b\_rms}$ and $U_{c\_rms}$ are effective voltage value of phases, and $C_a$, $C_b$ and $C_c$ are capacitance values of capacitors in the filter corresponding to the phases, and f is voltage frequency of the power grid.

S2. A first q-axis current reference value $I_{q1}^*$ is calculated according to the reactive power feedback value $Q_c$ and the reactive power reference value $Q^*$.

Specifically, the phase-locked loop 901 of FIG. 9 can be used to phase-lock the three-phase voltage feedback signal ($U_a$, $U_b$, $U_c$) to obtain a phase angle of voltage of the grid connection point. Then, the first dq converter 902 in FIG. 9 can be used to perform coordinate transformation on the three-phase voltage feedback signal ($U_a$, $U_b$, $U_c$) based on the phase angle to obtain a d-axis voltage positive sequence component $U_d^+$ in a synchronous rotating coordinate system.

And, the solver 903 in FIG. 9 is used to calculate a first q-axis current reference value $I_{q1}^*$ according to formula (5):

$$I_{q1}^* = \frac{Q^* - Q_c}{U_d^+} \quad (5)$$

Let the reactive power reference value of the $K^{th}$ sampling period is $Q^*(k)$, the reactive power feedback value of the grid side of the filter of the $K^{th}$ sampling period is $Q_c(k)$, and the d-axis voltage positive sequence of the $K^{th}$ sampling period is $U_d^+(k)$, the first q-axis current reference value of the $K^{th}$ sampling period $I_{q1}^*$, (k) is:

$$I_{q1}^+(k) = \frac{Q^*(k) - Q_c(k)}{U_d^+(k)} \quad (6)$$

S3. The reactive power feedback value $Q_f$ of the grid side of the filter is calculated according to instantaneous reactive power theory.

Specifically, α-axis voltage component $U_\alpha$ and β3-axis voltage component $U_\beta$ of the three-phase voltage feedback signal ($U_a$, $U_b$, $U_c$) under a two-phase static coordinate system can be calculated according to the formula (7) by using the three-phase (a, b, c) to two-phase (α, β) voltage coordinate converter 904 in FIG. 9:

$$\begin{bmatrix} U_\alpha \\ U_\beta \end{bmatrix} = C_{3/2} \begin{bmatrix} U_a \\ U_b \\ U_c \end{bmatrix} \quad (7)$$

$$C_{3/2} = \sqrt{\frac{2}{3}} \begin{bmatrix} 1 & -\frac{1}{2} & \frac{1}{2} \\ 0 & -\frac{\sqrt{3}}{2} & \frac{\sqrt{3}}{2} \end{bmatrix} \quad (8)$$

Where $C_{3/2}$ is a coordinate conversion matrix for transformation from three-phase (a, b, c) to two phases ($\alpha$, $\beta$).

And, $\alpha$-axis current component $I_\alpha$ and $\beta$-axis current component of the three-phase current feedback signal ($I_{a1}$, $I_{b1}$, $I_{c1}$) under a two-phase stationary coordinate system can be calculated according to the formula (9) by using the three-phase (a, b, c) to two-phase ($\alpha$,$\beta$) current coordinate converter 905 in FIG. 9:

$$\begin{bmatrix} I_\alpha \\ I_\beta \end{bmatrix} = C_{3/2} \begin{bmatrix} i_a \\ i_b \\ i_c \end{bmatrix} \quad (9)$$

where $C_{3/2}$ is the coordinate conversion matrix (see the formula (8)) of transformation from three-phase (a, b, c) to two-phase ($\alpha$, $\beta$).

The reactive power feedback value $Q_f$ of the grid side of the filter is then calculated according to formula (10):

$$Q_f = U_\beta \times I_\alpha - U_\alpha \times I_\beta \quad (10)$$

In an optional embodiment, the reactive power feedback value $Q_f$ of the grid side of the filter may also be filtered to improve accuracy of the reactive power feedback value.

S4. A second q-axis current reference value $I^*_{q2}$ is obtained according to the reactive power feedback value $Q_f$ and the reactive power reference value $Q^*$.

The second q-axis current reference value $I_{q2}^*$ may be calculated by using the reactive power regulator 907 in FIG. 9. The reactive power regulator 907 may be a PI (proportional-integral) regulator or a PID (proportional-integral-derivative) regulator.

Taking the PI regulator as an example, the second q-axis current reference value $I_{q1}^*$, is calculated by the following formulas:

$$Q_{err}(k) = Q^*(k) - Q_f(k) \quad (11)$$

$$\Delta I_{q2}^*(k) = kp \times [Q_{err}(k) - Q_{err}(k-1)] + ki \times Q_{err}(k) \quad (12)$$

$$I_{q2}^*(k) = \Delta I_{q2}^*(k) + I_{q2}^*(k-1) \quad (13)$$

Where $Q_{err}(k)$ is a reactive power deviation of the $k^{th}$ sampling period; $Q^*(k)$ is the reactive power reference value of the $k^{th}$ sampling period; $Q_f(k)$ is a calculated reactive power value of the $k^{th}$ sampling period; and $\Delta I^*_{q2}(k)$ is increment of the reactive power reference value of the $k^{th}$ sampling period; kp is a proportional adjustment value of the PI regulator; ki is an integral adjustment value of the PI regulator; and $I_{q2}^*(k)$ is the second q-axis current reference value of the $k^{th}$ sampling period.

S5, the q-axis voltage reference value $U_q^*$ is obtained by the Q-axis current regulator 909 in FIG. 9 according to sum ($I_{q1}^* + I_{q2}^*$) of the first q-axis current reference value $I_{q1}^*$ and the second q-axis current reference value $I_{q2}^*$, the q-axis current positive sequence component $I_q^+$ and the q-axis voltage positive sequence component $U_q^+$.

Specifically, the q-axis current positive sequence component $I_q^+$ may be obtained by the second dq converter 908 in FIG. 9 performing dq coordinate conversion of the three-phase current feedback signal ($I_{a2}$, $I_{b2}$, $I_{c2}$) based on the phase angle $\theta$. The q-axis voltage positive sequence component $U_q^+$ may be obtained by the first dq converter 902 in FIG. 9 performing dq coordinate conversion of the three-phase voltage feedback signal ($U_a$, $U_b$, ) based on the phase angle $\theta$.

S6. The d-axis current reference value $I_d^*$ is obtained by the DC bus voltage regulator 910 in FIG. 9 based on the DC bus voltage reference value $U_{dc}^*$ and the DC bus voltage $U_{db}$.

Taking the DC bus voltage regulator 910 as a PI regulator as an example, the The d-axis current reference value $I_d^*$; may be solved by the following formulas:

$$U_{DC\_err}(k) = U_{DC}^*(k) - U_{DC}(k) \quad (14)$$

$$\Delta I_d^*(k) = kp \times [U_{DC\_err}(k) - U_{DC\_err}(k-1)] + ki \times U_{DC\_err}(k) \quad (15)$$

$$I_d^*(k) = \Delta I_d^* + I_d^*(k-1) \quad (16)$$

where $U_{DC\_err}(k)$ is a DC bus voltage deviation value of the $k^{th}$ sampling period; $U_{DC}^*(k)$ is the DC bus voltage reference value of the $k^{th}$ sampling period; $U_{DC}(k)$ is the DC bus voltage sample value of the $k^{th}$ sampling period; $\Delta I_d^*(k)$ is increment of active power current reference value of the $k^{th}$ sampling period; kp is proportional adjustment value of the PI regulator; ki is integral adjustment value of the PI regulator; and $I_d^*(k)$ is active current reference value of the $k^{th}$ sampling period.

S7. The d-axis voltage reference value $U_d^*$ is obtained by the D-axis current regulator in FIG. 9 based on the d-axis current reference value $I_d^*$, the d-axis current positive sequence component $I_d^+$ a nd the d-axis voltage positive sequence component U.

Specifically, the d-axis current positive sequence component $I_d^+$ may be obtained by the second Parker converter 908 in FIG. 9 performing dq coordinate conversion of the three-phase current feedback signal ($I_{a2}$, $I_{b2}$, $I_{c2}$) based on the phase angle $\theta$; and the d-axis voltage positive sequence component may be obtained by the first Parker converter 902 in FIG. 9 performing dq coordinate conversion on the three-phase voltage feedback signal ($U_a$, $U_b$, $U_c$) based on the phase angle $\theta$.

In the reactive power closed-loop adjusting device of embodiments of the present application, after the q-axis voltage reference value and the d-axis voltage reference value are input to the modulation signal generator 912 in FIG. 9, the modulation signal generator 912 uses a specific modulation algorithm (such as an SVPWM modulation algorithm) to generate a PWM signal for controlling the switching device 2031 in the inverter. The PWM signal can be used by driving circuit to generate a control signal for driving gate of the switching device 2031 in the inverter, thereby controlling switching frequency of the switching device 2031 in the inverter and thereby reactive output frequency of the converter can be adjusted.

The reactive power open-loop adjusting device (not shown) is configured to obtain a PWM signal for driving the switching device 2031 in the converter according to the modulated reactive power reference value so as to adjust the reactive power outputted by the converter.

Compared with the reactive power open-loop adjusting device, the reactive power closed-loop adjusting device has higher control precision for the reactive power of the converter, and can thus make the reactive power of the converter more close to the modulated reactive power reference value.

Further, in order to improve control precision of the braking power, it is also possible to provide a braking power open-loop adjusting device or a braking power closed-loop adjusting device in the converter.

Figure 10:
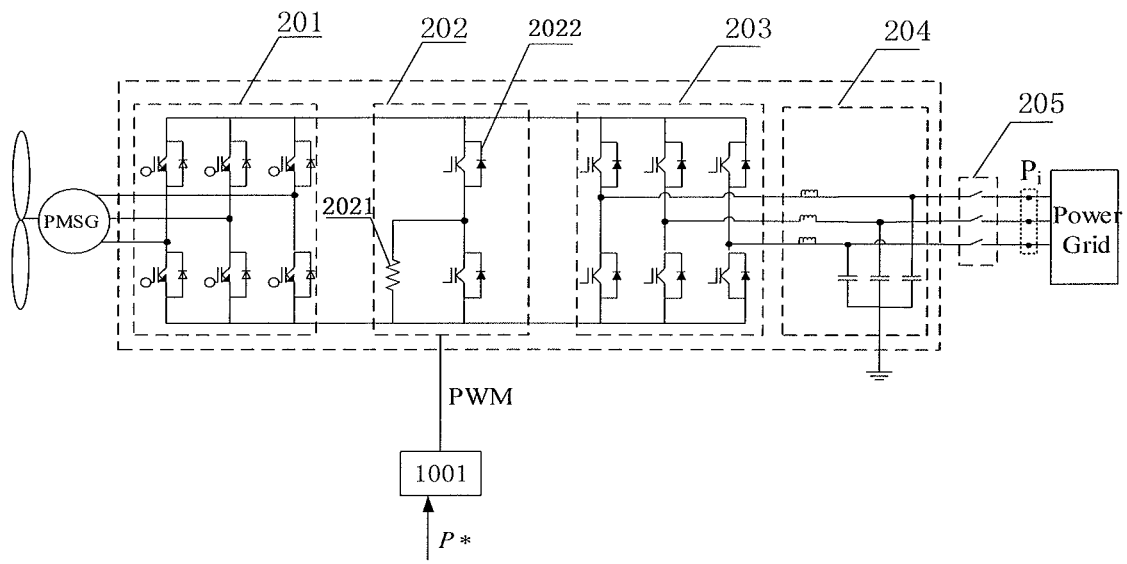
FIG. 10 is a schematic structural diagram of a braking power open-loop adjusting device according to an embodiment of the present application.

FIG. 10 is a schematic structural diagram of a reactive power open-loop adjusting device according to an embodiment of the present application. As shown in FIG. 10, the reactive power open-loop adjusting device 1001 obtains a PWM signal for driving a switching device 2022 in the braking unit based on the modulated reactive power reference value P*.

In an alternative embodiment, in conjunction with FIG. 10, a braking power closed-loop adjusting device (not shown) is configured to obtain, according to a voltage feedback signal (i.e., DC bus voltage signal) and the current feedback signal (i.e., the DC bus current signal) of the braking unit 202 in the converter after the modulation during short-circuit condition as well as the modulated braking power reference value P*, a PWM signal for driving the switching device 2022 in the braking unit 202 to adjust heating loss of a braking resistance 2021 such that the braking power of the braking unit 202 approaches the modulated braking power reference value P*.

Compared with the braking power open-loop adjusting device 202, the braking power closed-loop adjusting device has higher control precision for the braking power of the braking unit, and can make the braking power of the braking unit more close to the modulated braking power reference value.

Figure 11:
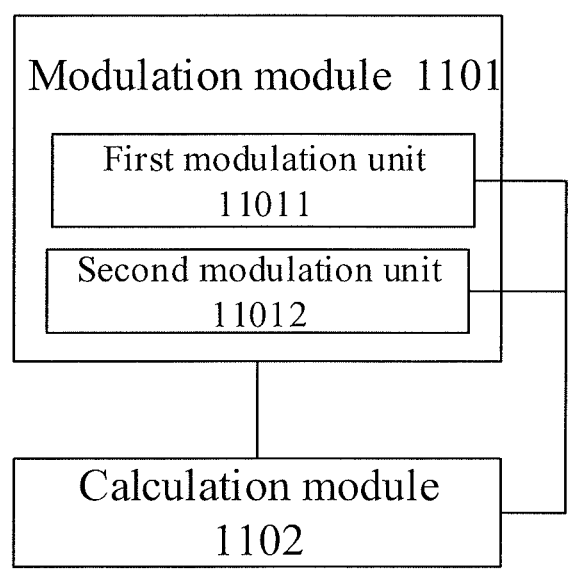
FIG. 11 is a schematic structural diagram of an apparatus for detecting a short-circuit capacity at a grid connection point of a wind turbine according to an embodiment of the present application.

FIG. 11 is a schematic structural diagram of an apparatus for detecting a short-circuit capacity at a grid connection point of a wind turbine according to an embodiment of the present application. As shown in FIG. 11, the apparatus for detecting the short-circuit capacity includes a modulation module 1101 and a calculation module 1102.

The modulation module 1101 is configured to modulate, when a converter is in a grid-side no-load modulation state and a power grid is in a short-circuited state with respect to the converter, a reactive power reference value and a braking power reference value of the converter, and collect a modulated three-phase voltage signal and a modulated three-phase current signal at the grid connection point of the wind turbine.

The calculation module 1102 is configured to obtain, according to the modulated three-phase voltage signal and the modulated three-phase current signal at the grid connection point of the wind turbine as well as a rated line voltage at the grid connection point of the wind turbine, the short-circuit capacity at the grid connection point of the wind turbine.

In an optional embodiment, as shown in FIG. 11, the modulation module 1101 may include a first modulation unit 11011. The first modulation unit 11011 is configured to perform, when a difference between the line impedance and the internal resistance is greater than a first predetermined threshold and a difference between an inductive reactance in the line impedance and a resistance in the line impedance is greater than a second predetermined threshold, a first no-load modulation operation on the converter in which the reactive power reference value is set to any power value between 0 and a rated apparent power of a inverter in the converter and, and the braking power reference value is set to zero.

In an optional embodiment, as shown in FIG. 11, the modulation module 1101 may further include a second modulating unit 11012. The second modulation unit 11012 configured to perform, when a difference between the line impedance and the internal resistance is greater than the first predetermined threshold and the difference between the inductive reactance in the line impedance and the resistance in the line impedance is not greater than the second predetermined threshold, the first no-load modulation operation and a second no-load modulation operation on the converter.

In the second no-load modulation operation, the reactive power reference value is set to 0, and the braking power reference value is set to any power value between 0 and the rated apparent power.

In an alternative embodiment, the apparatus for detecting the short-circuit capacity at a grid connection point of a wind turbine may be provided in a central control device of a wind farm (see FIG. 1) to avoid modification of existing hardware, or may be provided in a device having separate logic operation function, which is not limited herein.

It should be noted that the functional blocks shown in the structural block diagrams described above may be implemented as hardware, software, firmware, or a combination thereof. When implemented in hardware, it can be, for example, an electronic circuit, an application specific integrated circuit (ASIC), suitable firmware, plug-ins, function cards, and the like. When implemented in software, the elements of embodiments of the present application are programs or code segments that are used to perform the required tasks. The programs or code segments can be stored in a machine-readable medium or transmitted over a transmission medium or communication link through a data signal carried in carriers. A "machine-readable medium" can include any medium that can store or transfer information. Examples of machine-readable media include electronic circuits, semiconductor memory devices, ROMs, flash memory, erasable ROM (EROM), floppy disks, CD-ROMs, optical disks, hard disks, fiber optic media, radio frequency (RF) links, and the like. The code segments can be downloaded via a computer network such as the Internet, an intranet, and the like.

The foregoing is only specific embodiments of the present application, but the protection scope of the present application is not limited thereto, and any person skilled in the art can easily think of changes or substitutions within the technical scope disclosed in the present application, which all should be covered within the protection scope of the present application. Therefore, the protection scope of the present application should be determined by the scope of the claims.

The invention claimed is:

1. A method for determining a short-circuit capacity at a grid connection point of a wind turbine, wherein the wind turbine supplies power to a power grid via a converter, and the grid connection point is located between the converter of the wind turbine and the power grid, wherein the converter comprises a rectifier configured to rectify a three-phase alternating current generated by the wind turbine to a rectified direct current, a braking unit configured to consume active power of the rectified direct current and an inverter configured to reconvert the rectified direct current into a three-phase alternating current, wherein the method comprising:

modulating, when the wind turbine is in a shutdown or standby state and the power grid is electrically connected with the converter, a reactive power reference value and a braking power reference value of the converter, wherein the rectifier is in an unmodulated state and the inverter is in a modulated state, and a connection between the power grid and the converter is equivalent to a series connection of a low-voltage side power supply, an internal resistance and a line impedance, collecting a three-phase voltage and a three-phase current at he grid connection point of the wind turbine after the modulating;

collecting the three-phase voltage at the grid connection point of he wind turbine when the power grid is disconnected with the converter;

determining, according to the three-phase voltages and the three-phase current at the grid connection point of the wind turbine, the line impedance; and determining, according to the line impedance as well as a rated line voltage at the grid connection point of the wind turbine, the short-circuit capacity at the grid connection point of the wind turbine, wherein said modulating of the reactive power reference value and the braking power reference value of the converter comprise:

performing, when the internal resistance is much smaller than the line impedance and a resistance in the line impedance is much smaller than in inductive reactance in the line impedance, a first modulation operation on the converter in which the reactive power reference value is set to any power value between 0 and a rated apparent power of an inverter in the converter and the braking power reference value is set to zero.

2. The method according to claim 1, wherein said determination of the line impedance comprises:

obtaining, from the three-phase voltage and the three-phase current at the grid connection point of the wind turbine collected after the first modulation operation, a first short-circuit voltage effective value and a first reactive power feedback value;

obtaining, from the three-phase voltage'at the grid connection point of the wind turbine collected when the power grid is disconnected with the converter, a first initial voltage effective value; and determining the line impedance by determining the inductive reactance according to the first initial voltage effective value, the first short-circuit voltage effective value, and the first reactive power feedback value.

3. The method according to claim 2, wherein said determination of the line impedance comprises:

obtaining a second short-circuit voltage effective value, a second reactive power feedback value and a first active power feedback value from the three-phase voltage and the three-phase current collected after the first modulation operation, and obtaining a third short-circuit voltage effective value, a third reactive power feedback value and a second active power feedback value from the three-phase voltage and the three-phase current signal collected after the second modulation;

obtaining a second initial voltage effective value from the three-phase voltage at the grid connection point of the wind turbine collected when the power grid is disconnected with the converter;

determining the line impedance by determining the inductive reactance in the line impedance and the resistance in the line impedance according to the second initial voltage effective value, the second short-circuit voltage effective value, the second reactive power feedback value, the first active power feedback value, the third short-circuit voltage effective value, the third reactive power feedback value and the second active power feedback value.

4. The method according to claim 1, wherein said modulating the reactive power reference value and the braking power reference value of the converter comprises:

performing, when the internal resistance is much smaller than the line impedance and the resistance in the line impedance is not much smaller than the inductive reactance in the line impedance, the first modulation operation and a second modulation operation on the converter, wherein in the second modulation operation, the reactive powerreference value is set to 0, and the braking power reference value is set o any power value between 0 and the rated apparent power.

5. The method according to claim 4, wherein said determination of the line impedance comprises:

obtaining a second short-circuit voltage effective value, a second reactive power feedback value and a first active power feedback value from the three-phase voltage and the three-phase current collected after the first modulation operation, and obtaining a third short-circuit voltage effective value, a third reactive power feedback value and a second active power feedback value from the three-phase voltage and the three-phase current collected after the second modulation;

obtaining a second initial voltage effective value from the three-phase voltage at the grid connection point of the wind turbine collected when the power grid is disconnected with the converter;

determining the line impedance by determining the inductive reactance and in the line impedance and the resistance in the line impedance according to the second initial voltage effective value, the second short-circuit voltage effective value, the second reactive power feedback value, the first active power feedback value, the third short-circuit voltage effective value, the third reactive power feedback value and the second active power feedback value.

6. The method according to claim 1, wherein after said collecting the three-phase voltage and the three-phase current at the grid connection point of the wind turbine, the method further comprises:

obtaining, according to the three-phase voltage and the three-phase current at the grid connection point of the wind turbine as well as the modulated reactive power reference value, a PWM (Pulse Width Modulation) signal for driving a switching device in the converter such that a reactive power output by the converter approaches the modulated reactive power reference value; or obtaining, according to the modulated reactive power reference value, a PWM signal for driving a switching device in the converter so as to adjust a reactive power outputted by the converter.

7. The method according to claim 1, wherein after said collecting the modulated three-phase voltage and the modulated three-phase current at the grid connection point of the wind turbine, the method further comprises:

obtaining, according to a voltage feedback signal and a current feedback signal of a braking unit in the converter as well as the modulated braking power reference value, a PWM (Pulse Width Modulation) signal for driving a switching device of a braking power module in the braking unit such that a braking power of the braking unit approaches the modulated braking power reference value; or obtaining, according to the modulated reactive power reference value, a PWM signal for driving a switching device in the braking unit so as to adjust a braking power of the braking unit.

8. An apparatus for detecting a short-circuit capacity at a grid connection point of a wind turbine, wherein the wind turbine supplies power to a power grid via a converter, the grid connection point is located between the converter and the power grid, wherein the converter comprises a rectifier configured to rectify a generated three-phase alternating current to a rectified direct current, a braking unit configured to consume active power of the rectified direct current and an inverter configured to reconvert the rectified direct current into a three-phase alternating current, wherein the apparatus comprising:

a modulation module configured to modulate, when he wind turbine is in a shutdown or standby state and the power grid is electrically connected with the converter, a reactive power reference value and a braking power reference value of the converter, and collect a three-phase voltage and a three-phase current at the grid connection point of the wind turbine after the modulating, wherein the rectifier is in an unmodulated state and the inverter is in a modulated state, a connection between the power grid and the converter is equivalent to a series connection of a low-voltage side power supply, an internal resistance and a line impedance; and a calculation module configured to determine the line impedance according to the three-phase voltage and the three-phase current at the grid connection point of the wind turbine, and determine the short-circuit capacity at the grid connection point of the wind turbine according to the line impedance and a rated line voltage at the grid connection point of the wind turbine, wherein the modulation module comprises:

a first modulation unit configured to perform, when the internal resistance is much smaller than the lime impedance and the resistance in the line impedance is much smaller than the inductive reactance in the line impedance, a first modulation operation on the converter in which the reactive power reference value is set to any power value between 0 and a rated apparent power of a inverter in the converter and, and the braking power reference value is set to zero.

9. The apparatus according to claim 8, wherein the modulation module further comprises:

a second modulation unit configured to perform, when the internal resistance is much smaller than the line impedance and the resistance in the line impedance is not much smaller than the inductive reactance in the line impedance, the first modulation operation and a second modulation operation on the converter, wherein in the second modulation operation, the reactive power reference value is set to 0, and the braking power reference value is set to any power value between 0 and the rated apparent power.

10. The apparatus according to claim 9, wherein the apparatus is provided in a central control device of a wind farm.

11. The apparatus according to claim 8, wherein the apparatus is provided in a central control device of a wind farm.

12. The apparatus according to claim 8, wherein the apparatus is provided in a central control device of a wind farm.

* * * * *